(12) United States Patent
Ban

(10) Patent No.: US 7,368,337 B2
(45) Date of Patent: May 6, 2008

(54) SEMICONDUCTOR DEVICE AND MANUFACTURING METHOD THEREOF

(75) Inventor: Sang-Hyun Ban, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 22 days.

(21) Appl. No.: 11/317,796

(22) Filed: Dec. 22, 2005

(65) Prior Publication Data

US 2006/0145258 A1 Jul. 6, 2006

(30) Foreign Application Priority Data

Dec. 30, 2004 (KR) .................... 10-2004-0117418

(51) Int. Cl.
*H01L 27/088* (2006.01)
(52) U.S. Cl. .................... 438/152; 257/E21.614
(58) Field of Classification Search .............. 257/67, 257/69, 74, E21.614; 438/152, 486
See application file for complete search history.

(56) References Cited

U.S. PATENT DOCUMENTS

| | | | |
|---|---|---|---|
| 4,603,468 A * | 8/1986 | Lam ........................... | 438/153 |
| 4,654,121 A * | 3/1987 | Miller et al. ................. | 438/153 |
| 4,656,731 A * | 4/1987 | Lam et al. .................... | 438/153 |
| 4,679,299 A * | 7/1987 | Szluk et al. .................. | 438/153 |
| 4,686,758 A * | 8/1987 | Liu et al. ..................... | 438/153 |
| 5,083,190 A * | 1/1992 | Pfiester ........................ | 257/369 |
| 5,625,200 A * | 4/1997 | Lee et al. ..................... | 257/69 |
| 5,920,088 A * | 7/1999 | Augusto ...................... | 257/192 |
| 6,413,802 B1 * | 7/2002 | Hu et al. ...................... | 438/151 |
| 6,649,935 B2 * | 11/2003 | Hsu et al. ..................... | 257/67 |
| 6,649,980 B2 * | 11/2003 | Noguchi ...................... | 257/351 |
| 2003/0178699 A1 * | 9/2003 | Nakazato et al. ............ | 257/544 |
| 2004/0065927 A1 * | 4/2004 | Bhattacharyya ............. | 257/369 |
| 2005/0189583 A1 * | 9/2005 | Kim et al. .................... | 257/327 |

(Continued)

OTHER PUBLICATIONS

Goeloe, GT et al., "Vertical single-gate CMOS inverters on laser-processed multilayer substrates," 1981, Electron Devices Meeting, 1981 International, vol. 27 pp. 554-556.*

(Continued)

*Primary Examiner*—Lynne Gurley
*Assistant Examiner*—Colleen Matthews
(74) *Attorney, Agent, or Firm*—Andrew D. Fortney

(57) ABSTRACT

A semiconductor device and method of manufacturing the same are disclosed. An example semiconductor device includes a semiconductor substrate having a first well, a first source electrode, a drain electrode, and a first gate insulation layer formed on the semiconductor substrate, and a gate electrode formed on the first gate insulation layer. The example device also includes a second gate insulation layer formed on the gate electrode, a first source region formed on the semiconductor substrate between the first source electrode and the first gate insulation layer, a first drain region formed on the semiconductor substrate between the drain electrode and the first gate insulation layer, an insulating layer formed on the first source electrode, on the first source region, and on the first drain region, and a second source electrode formed on the insulating layer over the first source electrode. Additionally, a second source region is formed between the second source electrode and the second gate insulation layer, a second drain region formed between the drain electrode and the second gate insulation layer, and a second well formed on the second source region, on the second drain region, on the second source electrode, on the second gate insulation layer, and on the drain electrode.

9 Claims, 2 Drawing Sheets

U.S. PATENT DOCUMENTS

2005/0194616 A1* 9/2005 Yoon et al. ................. 257/213

OTHER PUBLICATIONS

Zhang, Shengdog et al. "A Stacked CMOS Technology on SOI Substrate," Sep. 2004, IEEE Electron Device Letters, vol. 25, No. 9 pp. 661-663.*

Robinson, A.L. et al. "Fabrication of Fully Self-Aligned Joint-Gate CMOS structures," Jun. 1985, IEEE Transactions on Electron Devices, vol. ED-32, No. 6, pp. 1140-1142.*

Zingg, R.P. et al. "High-Quality Stacked CMOS Inverter," Jan. 1990, IEEE Electron Device Letters, vol. 11, No. 1, pp. 9-11.*

* cited by examiner

SEMICONDUCTOR DEVICE AND MANUFACTURING METHOD THEREOF

RELATED APPLICATION

This application claims the benefit of Korean Application No. 10-2004-0117418 filed in the Korean Intellectual Property Office on Dec. 30, 2004, the entire contents of which are incorporated herein by reference.

TECHNICAL FIELD

The present disclosure relates to a semiconductor device and, more particularly, the present disclosure relates to a structure of a CMOS device and a manufacturing method thereof.

BACKGROUND

Generally, transistors of semiconductor devices are classified as NMOS, PMOS, or CMOS according type of channel employed in the transistors. An NMOS type transistor is formed with an N-channel, and a PMOS transistor with a P-channel. In addition, a CMOS (complementary metal oxide silicon) has both NMOS and PMOS, and, thus, both an N-channel and a P-channel are formed therein.

To form a CMOS type transistor, an n-well and a p-well are first formed in a horizontal direction on a semiconductor substrate by an ion implantation process, and then shallow trench isolation (STI) is formed. An STI structure prevents a malfunction between neighboring devices by electrically isolating the devices on a semiconductor substrate.

A well in a semiconductor substrate is classified as a p-well or an n-well according to the type of ions implanted in the well. A p-well is formed on the semiconductor substrate to form an NMOS structure, and an n-well is formed to form a PMOS structure. Subsequently, a gate oxide layer is formed on the semiconductor substrate, and then a polysilicon layer is formed thereon to form a gate stack. The gate stack forms a gate electrode of the NMOS and the PMOS using a photolithography process and an etching process.

Then, n-type dopants and p-type dopants are respectively implanted into the semiconductor substrate using the gate electrode of the NMOS or the PMOS as an implantation mask. Thus, a source/drain region is formed outward of the gate electrode on an active region of the semiconductor substrate.

As described above, the NMOS and the PMOS structures are formed in a horizontal direction in a typical CMOS process and, thus, a CMOS circuit occupies a larger area than does an NMOS circuit or a PMOS circuit. As a result, the CMOS circuit has a drawback in terms of integration.

The above information disclosed in this Background section is only for enhancement of understanding of the background of the invention and therefore it may contain information that does not form the prior art that is already known in this country to a person of ordinary skill in the art.

DETAILED DESCRIPTION

Figure 1:
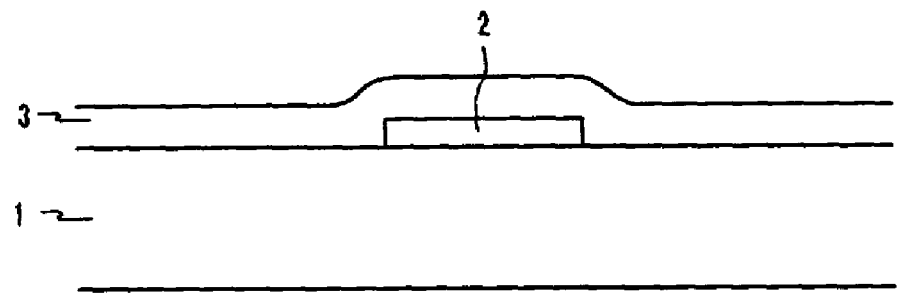
FIGS. 1 to 4 are cross-sectional views showing sequential stages of a method for manufacturing a semiconductor device according to an exemplary embodiment of the present invention.

In general, the example method described herein provides a higher degree of integration. An exemplary method of manufacturing a semiconductor device according to one example includes forming a first well by implanting ions into a semiconductor substrate; forming a first gate insulation layer on the semiconductor substrate; forming a first polysilicon layer on the first gate insulation layer; forming a gate electrode, a first source electrode, and a first drain electrode by patterning the first polysilicon layer; forming a first source region and a first drain region by ion implantation using the gate electrode, the first source electrode, and the first drain electrode as implantation masks; forming a second gate insulation layer on the gate electrode; forming an insulating layer on the entire surface over the semiconductor substrate; forming a source trench and a drain trench by etching the insulating layer; forming a second source electrode and a second drain electrode by filling the source trench and the drain trench with a second polysilicon layer; forming a second source region and a second drain region by forming a third polysilicon layer on an exposed region of the insulating layer and implanting ions into the third polysilicon layer; and forming a second well by forming a silicon layer on the entire surface over the semiconductor substrate and sequentially implanting ions into the silicon layer.

In a further embodiment, the first well and the second well may include different impurity ions and the source trench and the drain trench may be formed by a photolithography and etching process. Additionally, the insulating layer may be partially etched to remain over the first source electrode when forming the source trench and the insulating layer may be etched to expose an upper surface of the first drain electrode when forming the drain trench.

Still further, the first drain electrode and the second drain electrode may contact each other and form a single drain electrode, the gate electrode may receive input signals for controlling electrical signals of the first source electrode and the drain electrode, the gate electrode may receive input signals for controlling electrical signals of the second source electrode and the drain electrode, and the first and second source regions and the first and second drain regions may be formed by implanting impurity ions at a high concentration.

An example semiconductor device includes a semiconductor substrate having a first well; a first source electrode, a drain electrode, and a first gate insulation layer formed on the semiconductor substrate; a gate electrode formed on the first gate insulation layer; a second gate insulation layer formed on the gate electrode; a first source region formed on the semiconductor substrate between the first source electrode and the first gate insulation layer; a first drain region formed on the semiconductor substrate between the drain electrode and the first gate insulation layer; an insulating layer formed on the first source electrode, on the first source region, and on the first drain region; a second source electrode formed on the insulating layer over the first source electrode; a second source region formed between the second source electrode and the second gate insulation layer; a second drain region formed between the drain electrode and the second gate insulation layer; and a second well formed on the second source region, on the second drain region, on the second source electrode, on the second gate insulation layer, and on the drain electrode.

In a further embodiment, the gate electrode may be used as a common gate electrode for the first source electrode and the second source electrode, the drain electrode may be used as a common drain electrode for the first source electrode and the second source electrode, the first well and the second well may be composed of different impurity ions, and the first and second source regions and the first and second drain regions may be formed by implanting impurity ions at high concentration. In some examples, the insulating layer may be composed of PSG, BPSG, USG, or a low dielectric material.

Figure 2:
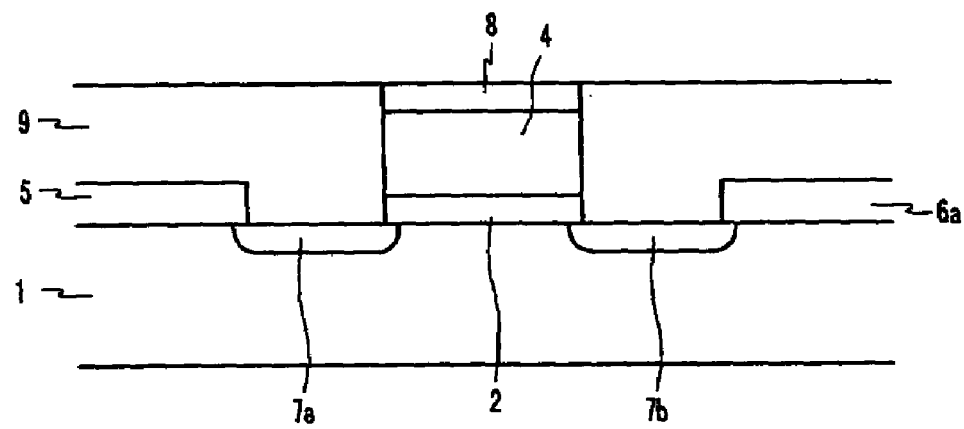
Figure 3:
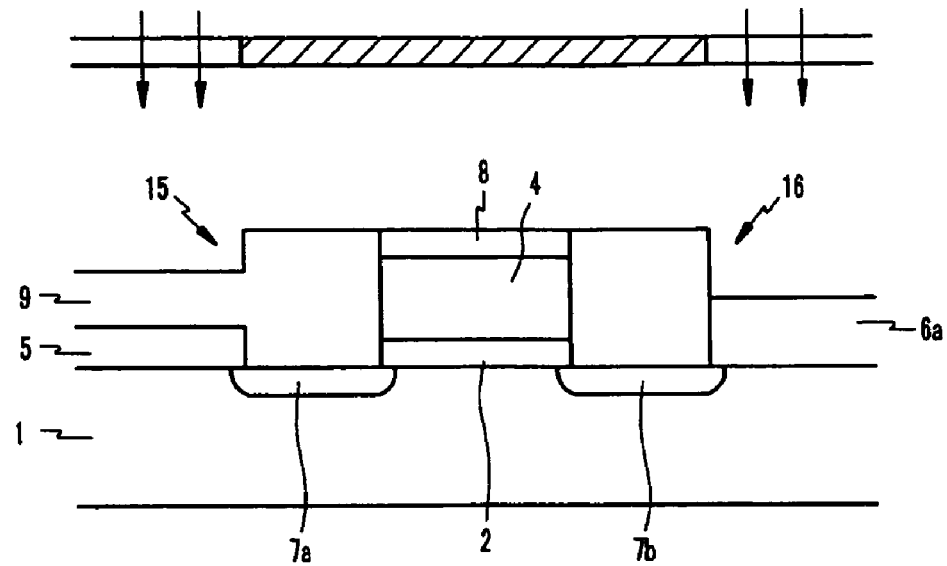

FIGS. 1 to 3 are cross-sectional views showing sequential stages of an example method for manufacturing a semiconductor device. First, as shown in FIG. 1, a p-well is formed by implanting ions into a semiconductor substrate 1, and a first gate insulation layer 2 is deposited thereon and patterned. In addition, a first polysilicon layer 3 is formed on the semiconductor substrate 1 and the first gate insulation layer 2.

Subsequently, as shown in FIG. 2, a first source electrode 5, a first drain electrode 6a and a gate electrode 4 are formed by patterning the first polysilicon layer 3. Then, a first source region 7a and a first drain region 7b are formed by implanting n-type impurity ions at a high concentration using the first source electrode 5, the first drain electrode 6a, and the gate electrode 4 as implantation masks.

Subsequently, a second gate insulation layer 8 is formed on the gate electrode 4, and then an insulating layer 9 is formed on the entire surface over the semiconductor substrate 1. Then, the insulating layer 9 is planarized to expose an upper surface of the second gate insulation layer 8 by a chemical mechanical polishing process. The insulating layer 9 is composed of an insulator material such as a low dielectric material, a phosphosilicate glass (PSG), a borophosphosilicate glass (BPSG), and an undoped silicate glass (USG).

Figure 4:
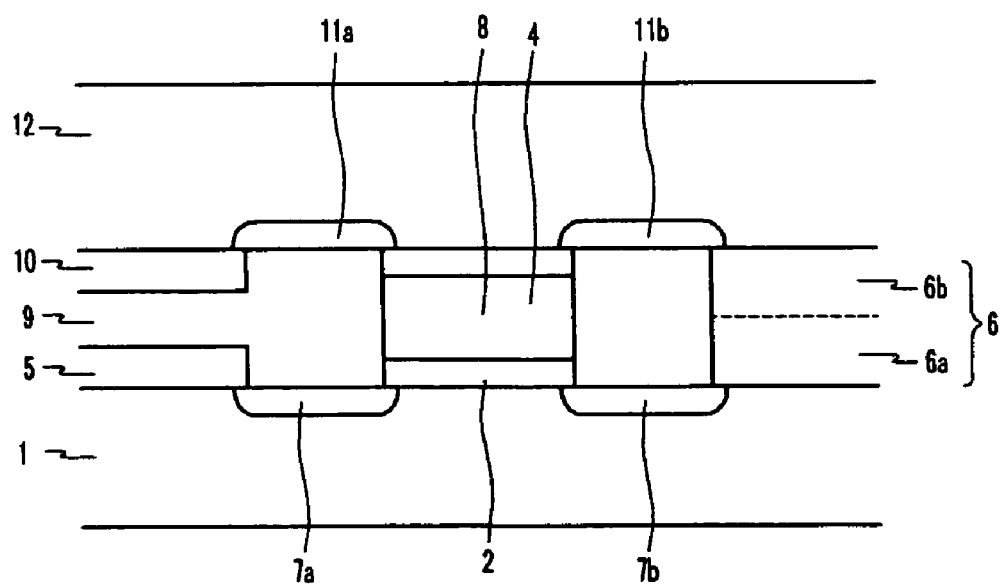

Then, as shown in FIG. 3, a source trench 15 and a drain trench 16 are respectively formed by patterning the insulating layer 9 using etching masks. In forming the drain trench 16, the insulating layer 9 is etched to expose an upper surface of the first drain electrode 6a. However, in forming the source trench 15, the insulating layer 9 is partially etched so as to remain over the first source electrode 5. Subsequently, with reference to FIG. 4, the source trench 15 and the drain trench 16 are filled with a second polysilicon layer so that a second source electrode 10 and a second drain electrode 6b are formed. At this time, the first drain electrode 6a and the second drain electrode 6b face each other to form a single drain electrode. Therefore, the drain electrode 6 is used as a common drain electrode for the first source electrode and the second source electrode.

Subsequently, a third polysilicon layer is formed and patterned on the insulating layer 9. A second source region 11a and a second drain region 11b are formed by implanting p-type impurity ions into the third polysilicon layer. The gate electrode receives input signals for controlling electrical signals of the first/second source electrode and the drain electrode.

Then, an upper silicon layer 12 is formed on the upper surface over the semiconductor substrate 1 and is planarized by a chemical mechanical polishing process. An n-well is formed in the upper silicon layer 12 by implanting ions therein, and thereby a CMOS process is completed.

In the above example, it has been described that an NMOS structure is located lower than a PMOS. However, it should not be understood that a PMOS may alternatively be located lower than an NMOS.

According to the present example, an n-well and a p-well are formed in a vertical direction, and thus a CMOS is formed within a width of a unit device. Therefore, a semiconductor device having CMOS structures can be made to have a higher degree of integration.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of manufacturing a semiconductor device, comprising:
    forming a first well by implanting ions into a semiconductor substrate; forming a first gate insulation layer on the semiconductor substrate;
    forming a first polysilicon layer on the first gate insulation layer; forming a gate electrode, a first source electrode, and a first drain electrode by patterning the first polysilicon layer; forming a first source region and a first drain region by ion implantation using the gate electrode, the first source electrode, and the first drain electrode as implantation masks;
    forming a second gate insulation layer on the gate electrode;
    forming an insulating layer on the entire surface over the semiconductor substrate;
    forming a source trench and a drain trench by etching the insulating layer, wherein the insulating layer is partially etched to remain over the first source electrode for forming the source trench and the insulating layer is etched to an upper surface of the first drain electrode for forming the drain trench;
    forming a second source electrode and a second drain electrode by filling the source trench and the drain trench with a second polysilicon layer, wherein the second drain electrode is faced to the first drain electrode for forming a single drain electrode;
    forming a second source region and a second drain region by patterning a third polysilicon layer on an exposed region of the insulating layer and implanting ions into the third polysilicon layer; and
    forming a second well by forming a silicon layer on the entire surface over the semiconductor substrate and sequentially implanting ions into the silicon layer.

2. The method of claim 1, wherein the first well and the second well comprise different impurity ions.

3. The method of claim 1, wherein the first and the second source regions and the first and second drain regions are formed by implanting impurity ions at a high concentration.

4. The method of claim 1, wherein the source trench and the drain trench are respectively formed by a photolithography and etching process.

5. The method of claim 4, wherein the insulating layer is partially etched to remain over the first source electrode when forming the source wench.

6. The method of claim 4, wherein the insulating layer is etched to expose an upper surface of the first drain electrode when forming the drain trench.

7. The method of claim 6, wherein the first drain electrode and the second drain electrode contact each other and form a single drain electrode.

8. The method of claim 7, wherein the gate electrode receives input signals for controlling electrical signals of the first source electrode and the drain electrode.

9. The method of claim 7, wherein the gate electrode receives input signals for controlling electrical signals of the second source electrode and the drain electrode.

* * * * *